United States Patent [19]
Taylor et al.

[11] Patent Number: 5,476,549
[45] Date of Patent: Dec. 19, 1995

[54] PROCESS FOR AN IMPROVED LAMINATE OF ZNSE AND ZNS

[75] Inventors: Raymond L. Taylor, Saugus; Lee E. Burns, Woburn; James C. MacDonald, Reading, all of Mass.

[73] Assignee: CVD, Inc., Woburn, Mass.

[21] Appl. No.: 393,770

[22] Filed: Feb. 24, 1995

Related U.S. Application Data

[62] Division of Ser. No. 378,030, Jan. 24, 1995.

[51] Int. Cl.$^6$ .................................................. C23C 16/00
[52] U.S. Cl. ................................. 118/728; 118/500
[58] Field of Search ........................... 118/728, 500

[56] References Cited

U.S. PATENT DOCUMENTS

| | | | |
|---|---|---|---|
| 4,834,022 | 5/1989 | Mahawili | 118/728 |
| 4,978,577 | 12/1990 | Purohit | 428/409 |
| 5,090,900 | 2/1992 | Rudolf | 118/728 |
| 5,376,180 | 12/1994 | Mahler | 118/728 |
| 5,383,971 | 1/1995 | Selbrede | 118/728 |

*Primary Examiner*—Richard Bueker
*Attorney, Agent, or Firm*—Robert M. Didrick; Gerald K. White

[57] ABSTRACT

The surface of a zinc selenide substrate is ground to curve in the opposite direction from that which occurs due to the bimetallic effect when zinc sulfide is deposited on a flat substrate by the chemical vapor deposition process. The bowing of the interface that occurs upon cooling of the hot laminate when the surface of the substrate is flat before deposition is compensated for by the pre-figured bowing. A distortion free window for the transmission of infra-red radiation is provided by this invention.

2 Claims, 4 Drawing Sheets

PRIOR ART

PROCESS FOR AN IMPROVED LAMINATE OF ZNSE AND ZNS

This is a divisional of co-pending application Ser. No. 08/378,030 filed on Jan. 24, 1995.

BACKGROUND OF THE INVENTION

This invention relates to a method for preparing an infra-red transmissive window that is substantially free of optical distortion. More particularly, it relates to a method for preparing a laminate of zinc selenide and zinc sulfide which overcomes the bimetallic effect arising from the different coefficients of thermal expansion of the two layers. The IR window made by this invention meets the demands of certain applications for which the prior art windows were either unsuitable or prohibitively expensive.

An improved method for the chemical vapor deposition of zinc sulfide on a zinc selenide substrate is taught in U.S. Pat. No. 4,978,577, which is incorporated herein by reference. There, the substrate is heated in the presence of $H_2S$ and the absence of zinc vapor for a certain period of time before the zinc vapor is introduced into the heating chamber. The adhesion of the zinc sulfide to the substrate is greatly improved by that treatment. A problem inherent in the high temperature lamination of materials having different coefficients of thermal expansion is the bowing of the laminate in response to the stress sometimes referred to as "the bimetallic effect." The deposition of the zinc sulfide occurs at a temperature of about 700° C. As the laminate is cooled to room temperature, the initially flat upper surface of the zinc selenide substrate becomes convex and the contiguous surface of the zinc sulfide is, perforce, concave. If the substrate is mounted in the heating chamber in such a way that it can not expand and contract freely, the bowing will not be symmetrical and will be extremely difficult to correct by optical grinding methods.

Infra-red transmissive windows made from such bowed laminates are difficult to use in wide-angle "forward looking infra-red imager" systems because of the optical path differences (OPD) for the light rays that pass through the window at different angles to the surface. As the angle of incidence grows larger, the OPD becomes greater. An optician can reduce the OPD by introducing some curvature into the outer surfaces of the laminate to compensate for the interfacial curvature. This is a lengthy and costly process, especially when the curvature is unsymmetrical. Thus, the bowing phenomenon is a deterrent to the widespread application of the ZnSe/ZnS laminate as an intra-red window.

SUMMARY OF THE INVENTION

It is an object of this invention, therefore, to provide a method for the production of a zinc selenide/zinc sulfide laminate having substantially no interfacial bowing.

It is a related object to provide a laminate of those materials that needs no optical correction even though laminate was made by chemical vapor deposition of the sulfide onto the selenide.

It is another related object to provide a "diffraction limited" optical system comprising a chemical vapor deposition laminate of zinc selenide and zinc sulfide.

These and other objects of the invention which will become apparent from the following disclosure and accompanying drawings are achieved by establishing a heading and cooling regimen for the chemical vapor deposition, determining the curvature of the interface between the substrate and the deposit which will occur during the cooling phase of said regimen, imparting the negative of that curvature to the surface of the substrate upon which the zinc sulfide is to be deposited, heating the substrate in a chemical vapor deposition chamber, coating that surface with the sulfide by chemical vapor deposition, and cooling the resulting laminate.

Another aspect of the invention is the provision of a mounting frame which allows free lateral, longitudinal, and transverse movement of the substrate so that it may expand and contract freely during and after the chemical vapor deposition of the zinc sulfide.

The amount and shape of the bowing that will occur may be calculated using modern finite-element modeling techniques since the mechanical and thermal properties of ZnSe and ZnS are well known. The calculation of stress induced by the bimetallic effect is taught by Roark, Raymond J. and Young, Warren C., "Formulas for Stress and Strain", 5th edn. McGraw-Hill, Inc., 1938, Section 10-4, pp 337–381, "Bimetallic Circular Plates", particularly in case 15a and also at page 366. The bowing may also be measured by conventional optical means, e.g., interferometry.

DESCRIPTION OF THE DRAWINGS

Turning now to the drawings.

DETAILED DESCRIPTION OF THE INVENTION

Figure 1:
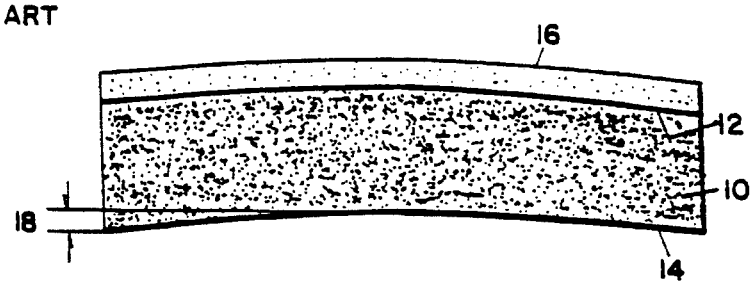
FIG. 1 is a cross section of a laminate of the prior art.

In FIG. 1, the ZnSe substrate 10 is bowed upward and is seen to have a convex upper surface 12 and a concave lower surface 14. The ZnS layer 16 is bowed in like manner. The amount of sag is shown at 18 by the dimension lines depicting the highest and lowest points of the curved surface.

Figure 2:
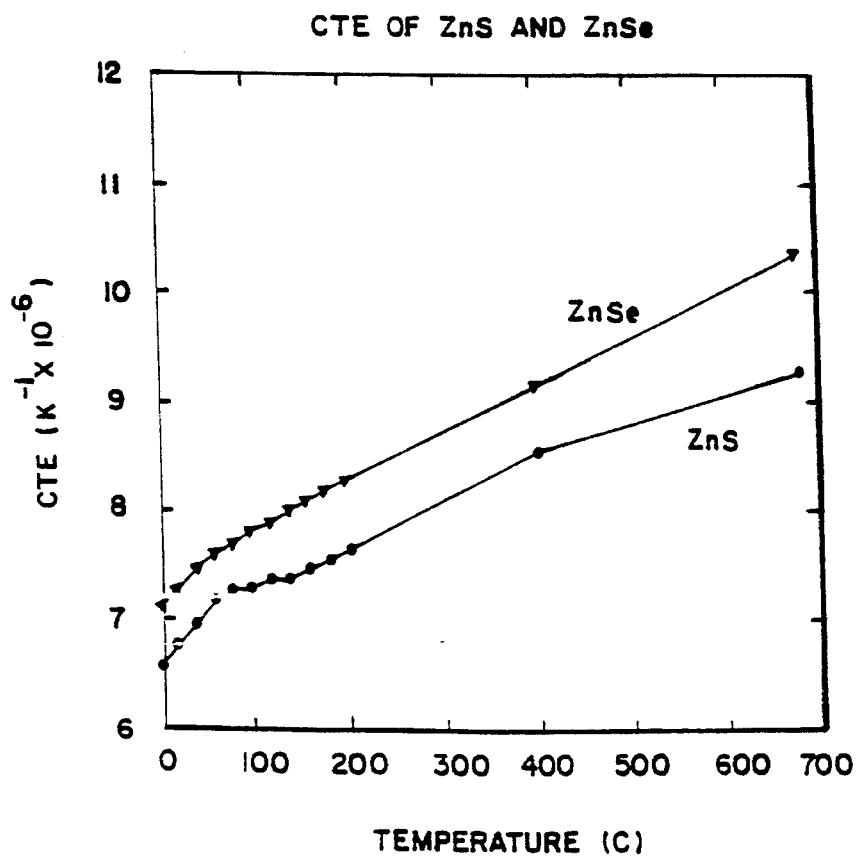
FIG. 2 is a graph of the coefficient of thermal expansion of ZnSe and ZnS at increasing temperatures.

The relation between the coefficient of thermal expansion and the temperature for both the ZnSe and the ZnS is shown in FIG. 2.

Figure 3:
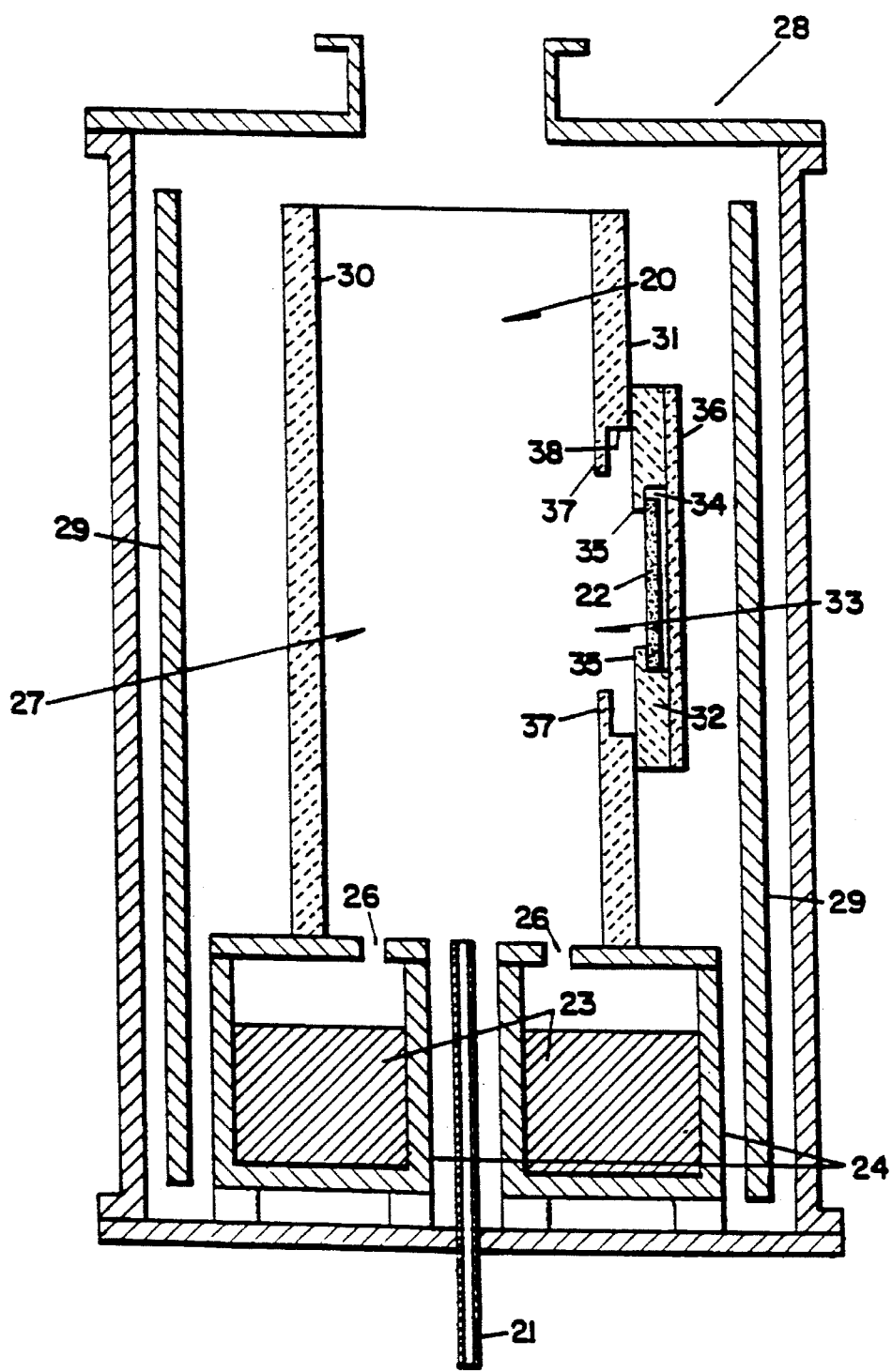
FIG. 3 is a cross section of a substrate mounted in a frame inside a chemical vapor deposition furnace according to this invention.
Figure 4:
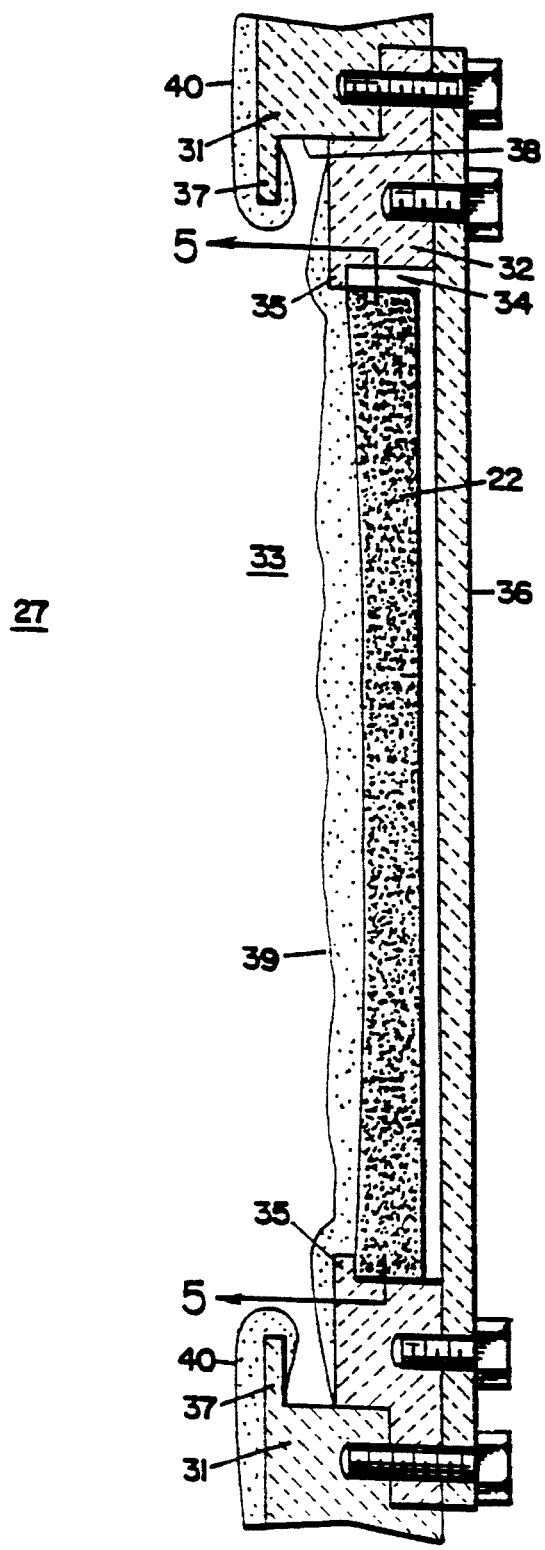
FIG. 4 is a cross-section of a broken away portion of a hot vapor deposition furnace wherein ZnS is deposited on the ZnSe substrate.
Figure 5:
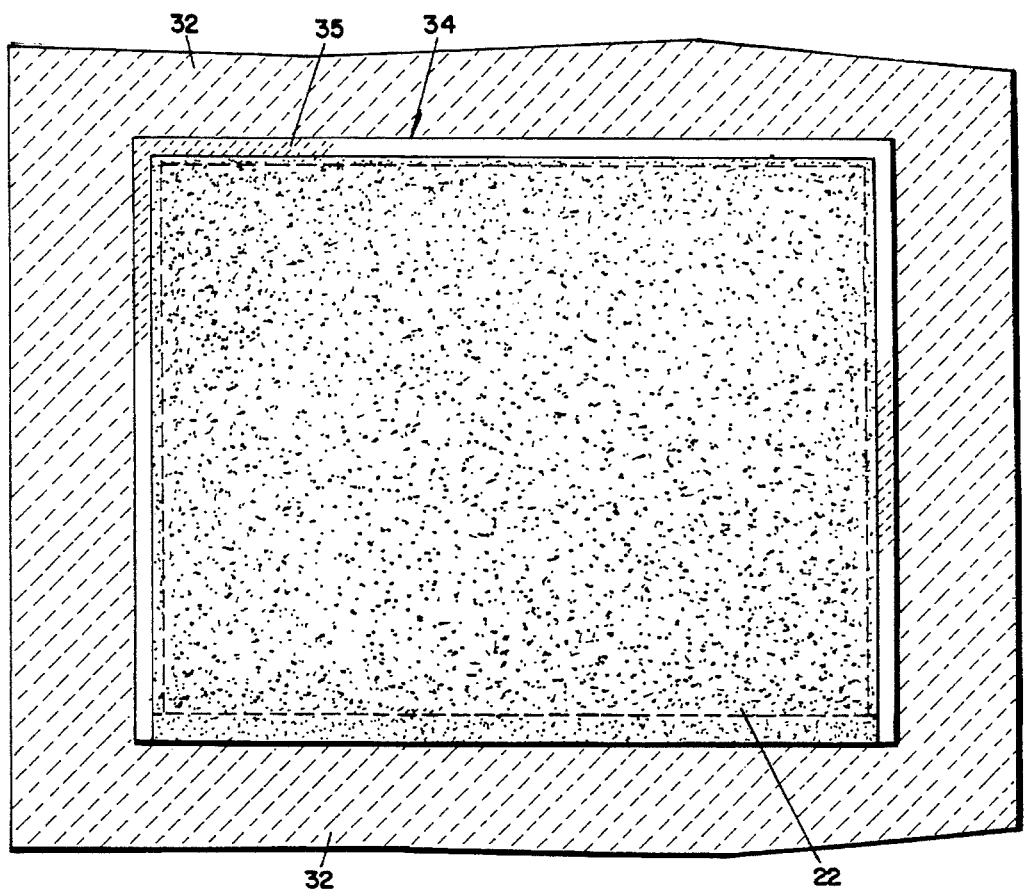
FIG. 5 is a sectional view taken along line 5—5 of FIG. 4.

In FIG. 3 $H_2S$ is introduced into the mandrel box 20 through the pipe 21 to contact the ZnSe substrate 22 in the absence of zinc vapor while the zinc metal 23 is being heated in the pots 24 and when the zinc reaches its vaporization temperature, the vapor flows through the ports 26 into the deposition zone 27. The mandrel box 20 is mounted upright in the furnace 28 between the heating elements 29. The box is made up of graphite plates, including the plates 30 and 31 shown here. The substrate holding frame 32 is mounted on the mandrel plate 31 in defining relation to the passage 33 through the plate 31 to place the substrate within the passage where it may be exposed to the vapors in the zone 27. As shown in larger detail in FIGS. 4 and 5, the opening 34 in the frame 32 is larger in each dimension than the substrate and the distance between a lip 35 and the back plate 36 is greater than the thickness of the substrate. A restraint-free assembly is thus made a part of the furnace 28 so that the bowing of the laminate upon cooling will be symmetrical and can be remedied by the method of this invention. The lips 35, which project toward each other from opposite boundaries of the opening 34 and are integral parts of the holding frame 32, are adapted to the support of the substrate in an upright position while blocking off only a minimal portion of the passage 33 for vapors traveling toward the substrate.

In like manner, the shields 37 are integral parts of the mandrel plate 31 which project toward each into the deposition zone from opposite boundaries of the passage 33. They are superposed over the outer periphery of the frame 32 to provide a shadowing effect whereby the deposition of ZnS in the recess 38 of the mandrel plate and in the corners between the frame and the plate is limited. The propagation of cracks from a ZnS coating 40 on the mandrel plate 31 and the shield 37 into the desired overcoat 39 on the substrate 22 is thereby minimized by isolation of the overcoat from the deposits 40.

Figure 7:
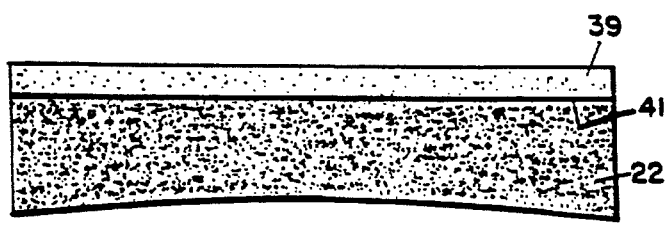
FIG. 7 is a cross section of the laminate of this invention after deposition of the ZnS and cooling.
Figure 6:
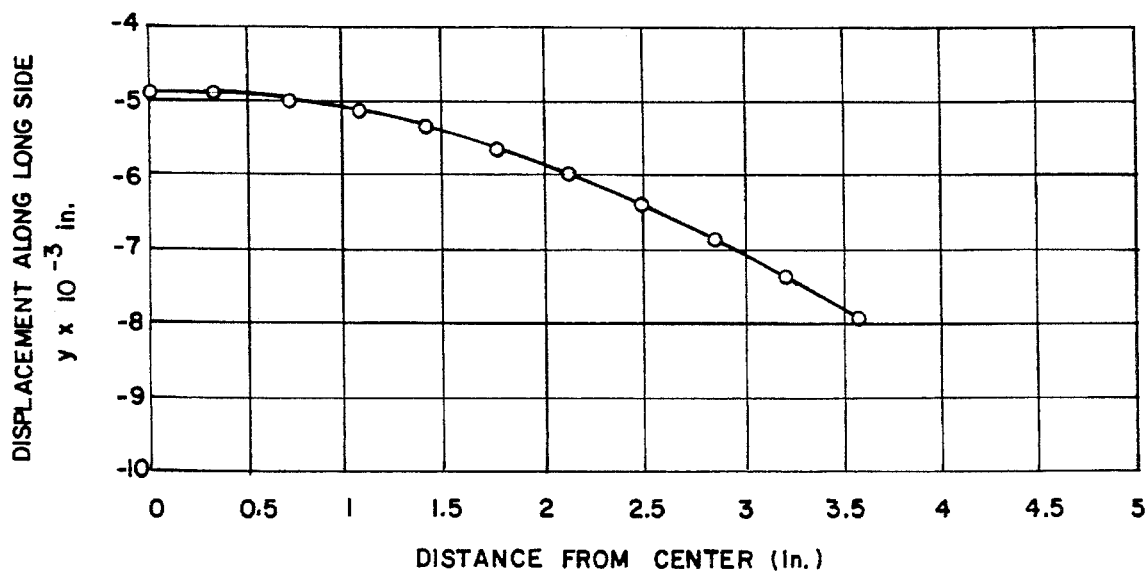
FIG. 6 is graph of the sag of a ZnSe/ZnS laminate of the prior art.

The amount and location of the bowing that would occur during the deposition of ZnS onto a ZnSe substrate are shown in FIG. 6. The substrate is 7.2 inches long, 5.5 inches wide, and 0.70 inch thick; the thickness of the ZnS is to be 0.125 inch. Using the ANSYS® finite element analysis program of Swanson Analysis Systems, Inc. on an ARIES ConceptStation® (Aries Technology, Inc.), the sag is calculated to be 78 μm. and symmetrical about the center of the laminate. From the results of that calculation and in accordance with this invention, a ZnSe substrate is ground and lapped to produce a blank having a concave spherical surface with a total sag of 78 μm. The blank is then mounted in the box 20 of FIG. 3 and that assembly is placed in the vapor deposition zone 27 and ZnS is deposited on the substrate at about 700° C. as described in U.S. Pat. No. 4,978,577. Upon cooling to room temperature, the laminate has a flat interface as shown at 41 in FIG. 7. The curvature that had been imparted to the substrate mechanically is cancelled by the bimetallic effect being put to work for us instead of against us. The following computer program may also be used to calculate the center sag of a laminate to be made by chemical vapor deposition of ZnS on a ZnSe substrate:

```
30  REM: This is a program to calculate maximum deflection
        and stress in a ZnS/ZnSe
40  REM: Window subjected to a change in temperature
50  REM: The equations used are from Roark
55  REM: ZnS is material 1, (top layer); ZnSe is material 2
        (bottom layer)
60  REM: Following are the variables used
70  REM: A - radius of plate in inches
80  REM: A1 - thermal expansion coef. of material 1 in
        inch/inch C
90  REM: A2 - Thermal expansion coef. of material 2 in
        inch/inch C
100 REM: DT - Temperature gradient in degrees C
110 REM: T1 - Thickness of material 1 in inches
120 REM: T2 - Thickness of material 2 in inches
130 REM: E1 - Modulus of material 1 in psi
140 REM: E2 - Modulus of material 2 in psi
150 REM: K1P - Derived constant
160 REM: V1 - Poisson's ratio of material 1
170 REM: V2 - Poisson's ratio of material 2
180 REM: KYC - Loading constant from Roark
310 LET A1=7.700001E-06
320 LET A2=8.300001E-06
330 INPUT "Temperature gradient"; DT
340 INPUT "Thickness of ZnS (material 1) in inches"; T1
350 INPUT "Thickness of ZnSe (material 2) in inches"; T2
360 LET E1=1.08E+07
370 LET E2=9750000!
380 LET V1=.29
390 LET V2=.28
400 LET KYC=.5
410 LET K1P=4+(6*T1/T2)+(4*(T1/T2)^2)+(E1*T1^
        3*(1-V2))/(E2*T2^3*(1-V1))+(E2*T2*
        (1-V1))/(E1*T1*(1-V2))
413 LET K2P=(1+((E2*T2^3*(1-V1^2))/
        (E1*T1^3*(1-V2^2)))+((3*(1-V1^2)
        *(1+T2/T1)^2*(1+E1*T1)/(E2*T2))))/
        ((1+E1*T1/(E2*T2))^2-(V1+(V2*E1*T1)/
        (E2*T2))^2)))
416 LET K3P=(1+((V2*E2*T2^3*(1-V2^2))/
        (V1*E1*T1^3*(1-V1^2)))+((3*
        (1-V1^2)*(1+T2/T1)^2*(1+(V2*E1*T1/
        (V1*T2*E2))))/((1+E1*T1/E2*T2)))^2-(V1+
        (V2*E1*T1/(E2*T2)))^2)))
420 LET X = (6*(A2-A1)*DT*(T1+T2)/(K1P*T2^2)
425 INPUT "Enter plate radius in inches"; A
427 REM: Calculate center deflection
430 LET Y = KYC*X*A^2
500 PRINT
510 PRINT
520 PRINT "ZnSe Thickness";T2;" inches","ZnS
        thickness";T1;"inches"
521 PRINT
522 PRINT "Plate radius";A;" inches","temperature
        gradient"; DT;" degrees C"
523 PRINT
530 PRINT "The maximum deflection is ";Y;" inches"
532 REM: Calculate stresses associated with deflection
535 LET VE = V1*(K3P/K2P)
540 LET DE = (E1*K2P*T1^3)/(1-V1^2))
545 LET L8 = .5*(1+VE)
550 LET M = DE*X*(1-VE)*(1-L8)
560 LET S1 = ((-1)*6*M/(T1^2*K2P))*
        (1+(((1-V1^2)*(1+T2/T1)*(1+(E1*T1/
        (E2*T2)))) ((1+(E1*T1/(E2*T2)))^2-(V1+
        (V2*E1*T1)/(E2*T2)))^2))-((A2-A1)*DT*E1/
        ((1-V1)*K1P*(3*T1/T2+2*(T1/T2)^2-((E2*T2*
        (1-V1))/(E1*T1*(1-V2)))))
563 LET S2A = E2*T2*(1-V1^2)/(E1*T1*(1-V2^2))
565 LET S2N = (1-V1^2)*(1+T2/T1)*(1+E1*T1/(E2*T2))
567 LET S2D = (1+E1*T1/(E2*T2))^2-(V1+V2*E1*T1/
        (E2*T2))^2
568 LET S2S = ((A2-A1)*DT*E2)/((1-V2)*K1P)*(3*
        (T1/T2)+2-((E1*T1^3*(1-V2))/(E2*T2^3*
        (1-V1))))
570 LET S2 = (6*M/(T1^2*K2P))*(S2A+(T1/T2)
        *S2N/S2D)+S2S
575 PRINT
576 PRINT
580 PRINT "The stress of top surface of ZnS is ";S1;"PSI"
590 PRINT "The stress on bottom surface of SnSe is ";S2;
        "PSI"
750 END
```

NOTE:
An asterisk is a multiplication sign here, ^ indicates superscript follows A particular example of the process of this invention is as follows:

The potential center sag of the interface of a laminate window measuring 11.75×7.25 inches and having a ZnSe thickness of 0.72 inch and a ZnS thickness of 0.06 inch was calculated, using the above program, to be 22.9 μm over a 6 inch chord spanning the bowed interface. A ZnSe substrate having the recited dimensions was then fabricated to have a concave surface with a radius of curvature equal to −5000± 500 inches and the calculated center sag on one side. The substrate was loaded into the restraint-free holding frame 32 and the assembly was mounted over the passage 33 of the plate 31 so than the concave surface would be exposed to the zinc and H$_2$S vapors in the zone 27. Ater the substrate was coated with the ZnS to the desired thickness of 0.06 inch and the laminate was cooled, the window was ground flat on the top and bottom surfaces to the proper thicknesses. The radius of curvature of the interface was measured as −347,640 inches and the center sag was −0.3 µm over the 6 inch span. Thus, the bowing of the interface was reduced more than 98%.

The method of this invention places no limits on the dimensions of the window that may be produced—one measuring 18×12 inches having been fabricated by it—but as a practical matter the larger the window the thicker it must be for rigidity. Because its transmission in the infra-red is poorer than that of the ZnSe, the thickness of the ZnS layer on the final window should be no greater than what is required for its function as a protector of the substrate against erosion by rain and dust particles at high speeds. The minimal thickness for that protection is about 0.030 inch. The actual thickness deposited, however, will be considerably greater, i.e., about 0.10 inch, to allow for the optical grinding and polishing that is necessary to provide the desired window.

The window prepared by the method of this invention is essentially "diffraction limited", the optimal condition when one is considering the distortion of an image by an optical system. The transmitted wave front aberration for rays that are not normal to the surface of the window prepared according to this invention is less than 0.1 of a wavelength for rays 40°–60° from normal. In contrast, the window having the curved interface caused by the bimetallic effect gave aberrations in the range of 0.3–0.7 wavelength in the infra-red (i.e., one wavelength=10.6 µm).

The subject matter claimed is:

1. In a chemical vapor deposition apparatus comprising a furnace, a mandrel box mounted within the furnace and defining a vapor deposition zone, the box comprising a mandrel plate having a passage therein communicating with the deposition zone, a substrate holding frame removably mounted on said mandrel plate in overlapping relation to the passage and having an opening therein in alignment with said mandrel plate passage, and a back plate removably mounted on holding frame plate as a closure for the opening, the improvement comprising:

a restraint-free substrate holding frame and back plane assembly having lips projecting toward each other from opposite boundaries of the opening in the frame and between the deposition zone and the back plate, the lips adapted for support of a substrate to be placed in the opening, the opening otherwise being larger than the substrate to be placed in said opening, and the distance between the lips and the back plate being larger than the thickness of the substrate.

2. The improved apparatus of claim 1 further characterized by shields projecting toward each other from opposite boundaries of the passage through the mandrel plate into the deposition zone and spaced apart from the holding frame.

* * * * *

UNITED STATES PATENT AND TRADEMARK OFFICE
CERTIFICATE OF CORRECTION

PATENT NO. : 5,476,549
DATED : December 19, 1995
INVENTOR(S) : Taylor et al.

It is certified that error appears in the above-indentified patent and that said Letters Patent is hereby corrected as shown below:

Col. 1, Ln. 56, after "though" insert -- the --.

Col. 1, Ln. 63, before "accompanying" insert -- the --.

Col. 1, Ln. 64, change "heading" to read -- heating --.

Col. 6, Ln. 14, before "holding" insert -- the --.

Col. 6, Ln. 16, change "plane" to read -- plate --.

Signed and Sealed this

Thirtieth Day of July, 1996

Attest:

BRUCE LEHMAN

*Attesting Officer*     *Commissioner of Patents and Trademarks*

UNITED STATES PATENT AND TRADEMARK OFFICE
CERTIFICATE OF CORRECTION

PATENT NO. : 5,476,549
DATED : December 19, 1995
INVENTOR(S) : Taylor et al.

It is certified that error appears in the above-indentified patent and that said Letters Patent is hereby corrected as shown below:

Col. 1, Ln. 5, after "Jan. 24, 1995" insert -- , which was a continuation of application Serial No. 07/960,756, filed October 14, 1992, now abandoned, which was a division of 07/729,980, filed July 15, 1991, now U.S. Patent No. 5,183,689. --.

Signed and Sealed this

Twelfth Day of November, 1996

Attest:

BRUCE LEHMAN

*Attesting Officer*  *Commissioner of Patents and Trademarks*